US011393955B2

(12) United States Patent
Huang et al.

(10) Patent No.: US 11,393,955 B2
(45) Date of Patent: Jul. 19, 2022

(54) LIGHT EMITTING DIODE AND MANUFACTURING METHOD THEREOF

(71) Applicant: Genesis Photonics Inc., Tainan (TW)

(72) Inventors: Yi-Ru Huang, Tainan (TW); Kai-Shun Kang, Tainan (TW); Tung-Lin Chuang, Tainan (TW); Yu-Chen Kuo, Tainan (TW); Yan-Ting Lan, Tainan (TW); Chih-Ming Shen, Tainan (TW); Jing-En Huang, Tainan (TW)

(73) Assignee: Genesis Photonics Inc., Tainan (TW)

( * ) Notice: Subject to any disclaimer, the term of this patent is extended or adjusted under 35 U.S.C. 154(b) by 213 days.

(21) Appl. No.: 16/705,255

(22) Filed: Dec. 6, 2019

(65) Prior Publication Data
US 2020/0220050 A1    Jul. 9, 2020

Related U.S. Application Data

(63) Continuation-in-part of application No. 16/531,148, filed on Aug. 5, 2019.
(Continued)

(51) Int. Cl.
| *H01L 27/15* | (2006.01) |
| *H01L 33/46* | (2010.01) |
| *H01L 33/00* | (2010.01) |
| *H01L 33/14* | (2010.01) |
| *H01L 33/38* | (2010.01) |

(52) U.S. Cl.
CPC .......... *H01L 33/465* (2013.01); *H01L 33/007* (2013.01); *H01L 33/145* (2013.01); *H01L 33/382* (2013.01); *H01L 33/385* (2013.01); H01L 2933/0016 (2013.01); H01L 2933/0025 (2013.01)

(58) Field of Classification Search
None
See application file for complete search history.

(56) References Cited

U.S. PATENT DOCUMENTS

| 7,180,094 B2 | 2/2007 | Seong et al. |
| 9,595,640 B2 * | 3/2017 | Bae ........................ H01L 33/486 |

(Continued)

OTHER PUBLICATIONS

"Office Action of US Related Application, U.S. Appl. No. 16/531,148", dated Apr. 15, 2021, p. 1-p. 14.

*Primary Examiner* — Hung K Vu
(74) *Attorney, Agent, or Firm* — JCIPRNET

(57) ABSTRACT

A light emitting diode (LED) including an epitaxial stacked layer, first and second reflective layers which are disposed at two sides of the epitaxial stacked layer, a current conducting layer and first and second electrodes and a manufacturing thereof are provided. The epitaxial stacked layer includes a first-type and a second-type semiconductor layers and an active layer. A main light emitting surface with a light transmittance >0% and ≤10% is formed on one of the two reflective layers. The current conducting layer contacts the second-type semiconductor layer. The first electrode is electrically connected to the first-type semiconductor layer. The second electrode is electrically connected to the second-type semiconductor layer via the current conducting layer. A contact scope of the current conducting layer and the second-type semiconductor layer is served as a light-emitting scope overlapping the two layers, but not overlapping the two electrodes.

11 Claims, 15 Drawing Sheets

Related U.S. Application Data

(60) Provisional application No. 62/775,904, filed on Dec. 6, 2018, provisional application No. 62/714,098, filed on Aug. 3, 2018, provisional application No. 62/816,922, filed on Mar. 12, 2019, provisional application No. 62/865,997, filed on Jun. 25, 2019.

(56) References Cited

U.S. PATENT DOCUMENTS

| | | | |
|---|---|---|---|
| 2010/0163901 A1* | 7/2010 | Fudeta | H01L 33/007 257/E33.013 |
| 2015/0333241 A1 | 11/2015 | Chen et al. | |
| 2017/0062676 A1* | 3/2017 | Kondo | H01L 33/44 |
| 2018/0145224 A1 | 5/2018 | Kim et al. | |

* cited by examiner

LIGHT EMITTING DIODE AND MANUFACTURING METHOD THEREOF

CROSS-REFERENCE TO RELATED APPLICATION

This application is a continuation-in-part application of and claims the priority benefit of U.S. application Ser. No. 16/531,148, filed on Aug. 5, 2019, now pending, which claims the priority benefits of U.S. provisional application Ser. No. 62/714,098, filed on Aug. 3, 2018, U.S. provisional application Ser. No. 62/816,922, filed on Mar. 12, 2019, and U.S. provisional application Ser. No. 62/865,997, filed on Jun. 25, 2019. This application also claims the priority benefit of U.S. provisional application Ser. No. 62/775,904, filed on Dec. 6, 2018. The entirety of each of the above-mentioned patent applications is hereby incorporated by reference herein and made a part of this specification.

BACKGROUND

Field of the Invention

The invention relates to a light emitting diode (LED) and a manufacturing method thereof and more particularly, to a resonant cavity light emitting diode (RCLED) and a manufacturing method thereof.

Description of Related Art

The advent of the 5G era has brought application requirements for high data transmission volumes and also driven related periphery construction for data centers, and among them, optic fiber communication transceiver modules are key components for the data centers. As an optical fiber has a small light-receiving area, the optic fiber is incapable of effectively receiving the light if a light-emitting angle of a light source is too large, and thus, a light source capable of emitting a high directional light is required to serve as a light source of an optic fiber communication transceiver module. Among the currently available optic fiber communication transceiver modules, laser serves as a light source of the optic fiber communication transceiver module because of its high directivity, but due to costing expensive, may keep manufacturing cost of the optic fiber communication transceiver module in a high level. Therefore, how to manufacture a light emitting element with low cost but high directivity is one of the issues to be solved by the technicians of this field.

SUMMARY

The invention provides a light emitting diode (LED) having high directivity and be suitable for serving as a light source with a directional light source or an optic fiber communication transceiver module.

The invention provides a manufacturing method of an LED for manufacturing the aforementioned LED.

A light emitting diode (LED) provided by an embodiment of the invention includes an epitaxial stacked layer, a first reflective layer, a second reflective layer, a current conducting layer, a first electrode and a second electrode. The epitaxial stacked layer includes a first-type semiconductor layer, an active layer and a second-type semiconductor layer. The active layer is disposed between the first-type semiconductor layer and the second-type semiconductor layer, and the electrical property of the first-type semiconductor layer is opposite to that of the second-type semiconductor layer. The epitaxial stacked layer has a first side adjacent to the first-type semiconductor layer and a second side adjacent to the second-type semiconductor layer. The first reflective layer is disposed at the first side of the epitaxial stacked layer. The second reflective layer is disposed at the second side of the epitaxial stacked layer. A main light emitting surface is formed on one of the first reflective layer and the second reflective layer, and a light transmittance of the main light emitting surface is greater than 0% and less than or equal to 10%. The current conducting layer is in contact with the second-type semiconductor layer. The first electrode is electrically connected to the first-type semiconductor layer. The second electrode is electrically connected to the second-type semiconductor layer via the current conducting layer, wherein a contact scope of the current conducting layer and the second-type semiconductor layer is served as a light-emitting scope. The light-emitting scope overlaps the first reflective layer and the second reflective layer, but does not overlap the first electrode and the second electrode.

In an embodiment of the invention, the epitaxial stacked layer has a mesa portion and a recess portion which is recessed with respect to the mesa portion. The mesa portion comprises a part of the first-type semiconductor layer, the active layer and the second-type semiconductor layer, and the recess portion comprises the other part of the first-type semiconductor layer. The first electrode overlaps the recess portion, and the second electrode overlaps the mesa portion.

In an embodiment of the invention, a first distance is configured between the first electrode and the second reflective layer, and a second distance is configured between the second electrode and the second reflective layer.

In an embodiment of the invention, the LED includes a substrate. The epitaxial stacked layer, the second reflective layer, the current conducting layer, the first electrode and the second electrode are disposed at one side of the substrate, and the first reflective layer is disposed at another side of the substrate.

In an embodiment of the invention, the LED includes a conductive substrate. The epitaxial stacked layer, the second reflective layer, the current conducting layer and the first electrode are disposed at one side of the conductive substrate, and the second reflective layer is disposed at another side of the conductive substrate. The second electrode is electrically connected to the second-type semiconductor layer via the current conducting layer and the conductive substrate.

In an embodiment of the invention, the second reflective layer has a plurality of first through holes, and at least a part of the first through holes overlap the second-type semiconductor layer.

In an embodiment of the invention, the second reflective layer has a plurality of first through holes, and the first through holes do not overlap the second-type semiconductor layer.

In an embodiment of the invention, the LED includes a current blocking layer. The current blocking layer is disposed between the epitaxial stacked layer and the current conducting layer and has at least one second through hole, the at least one second through hole exposes a part of the epitaxial stacked layer, and the current conducting layer is in contact with the second-type semiconductor layer by passing through the at least one second through hole.

In an embodiment of the invention, a light transmittance of the first reflective layer is greater than a light transmittance of the second reflective layer.

In an embodiment of the invention, the light transmittance of the second reflective layer is greater than the light transmittance of the first reflective layer.

In an embodiment of the invention, at least one of the first electrode and the second electrode includes a welding portion and at least one finger portion extended from the welding portion.

A manufacturing method of a light emitting diode (LED) provided by an embodiment of the invention includes the following steps. An epitaxial stacked layer is formed on a substrate, wherein the epitaxial stacked layer includes a first-type semiconductor layer, an active layer and a second-type semiconductor layer. The active layer is disposed between the first-type semiconductor layer and the second-type semiconductor layer, and the electrical property of the first-type semiconductor layer is opposite to that of the second-type semiconductor layer, wherein the epitaxial stacked layer has a first side adjacent to the first-type semiconductor layer and a second side adjacent to the second-type semiconductor layer. A current conducting layer is formed on the epitaxial stacked layer and is in contact with the second-type semiconductor layer of the epitaxial stacked layer. A first reflective layer and a second reflective layer are respectively formed at the first side and the second side of the epitaxial stacked layer, wherein a main light emitting surface is formed on one of the first reflective layer and the second reflective layer, and a light transmittance of the main light emitting surface is greater than 0% and less than or equal to 10%. A contact scope of the current conducting layer and the second-type semiconductor layer is served as a light-emitting scope, and the light-emitting scope overlaps the first reflective layer and the second reflective layer. A first electrode and a second electrode are respectively formed to be electrically connected to the first-type semiconductor layer and the second-type semiconductor layer respectively, and the second electrode is electrically connected to the second-type semiconductor layer via the current conducting layer, wherein the light-emitting scope does not overlap the first electrode and the second electrode.

In an embodiment of the invention, in the step of respectively forming the first electrode and the second electrode to be electrically connected to the first-type semiconductor layer and the second-type semiconductor layer respectively, both the first electrode and the second electrode are formed at the second side of the epitaxial stacked layer.

In an embodiment of the invention, in the step of respectively forming the first electrode and the second electrode to be electrically connected to the first-type semiconductor layer and the second-type semiconductor layer respectively, the first electrode and the second electrode are respectively formed at the first side and the second side of the epitaxial stacked layer.

In an embodiment of the invention, the step of forming the epitaxial stacked layer on the substrate further includes the following steps. An etching process is performed on the epitaxial stacked layer to define a mesa portion and a recess portion, wherein the mesa portion comprises a part of the first-type semiconductor layer, the active layer and the second-type semiconductor layer, and the recess portion comprises the other part of the first-type semiconductor layer.

To sum up, in the LED provided by the embodiments of the invention, the contact scope of the current conducting layer and the second-type semiconductor layer is served as the light-emitting scope, and the first and the second reflective layers overlap the light-emitting scope. Additionally, the main light emitting surface is formed on one of the first and the second reflective layers, and the light transmittance of the main light emitting surface is greater than 0% and less than or equal to 10%. Thus, a part of light beams emitted from the active layer are transmitted through the first reflective layer (or the second reflective layer), and a part of the light beams are reflected between the first and the second reflective layers one or more times to generate an effect similar to a laser resonant cavity, so as to be transmitted through the first reflective layer (or the second reflective layer). The light-emitting scope does not overlap the first and the second electrodes, a light-emitting angle of the LED can be significantly reduced, and thus, the LED can have high directivity and is suitable for serving as a light source for an optic fiber communication transceiver module. Moreover, the manufacturing method of the LED provided by one of the embodiments of the invention can be used to manufacture the LED described above and has lower manufacturing cost in comparison with the laser manufacturing.

DESCRIPTION OF EMBODIMENTS

Figure 1A:
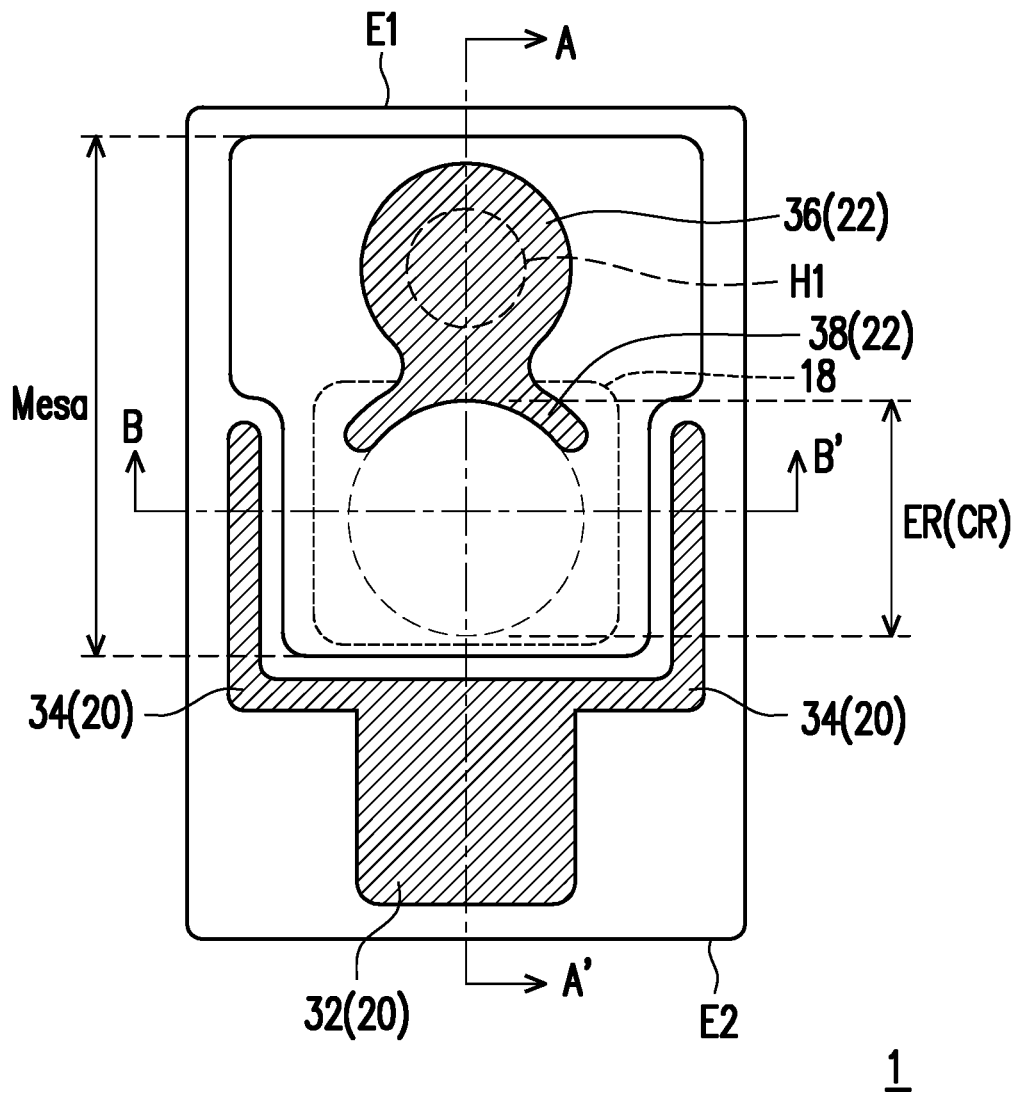
FIG. 1A is a top view showing a light emitting diode (LED) according to an embodiment of the invention.
Figure 1B:
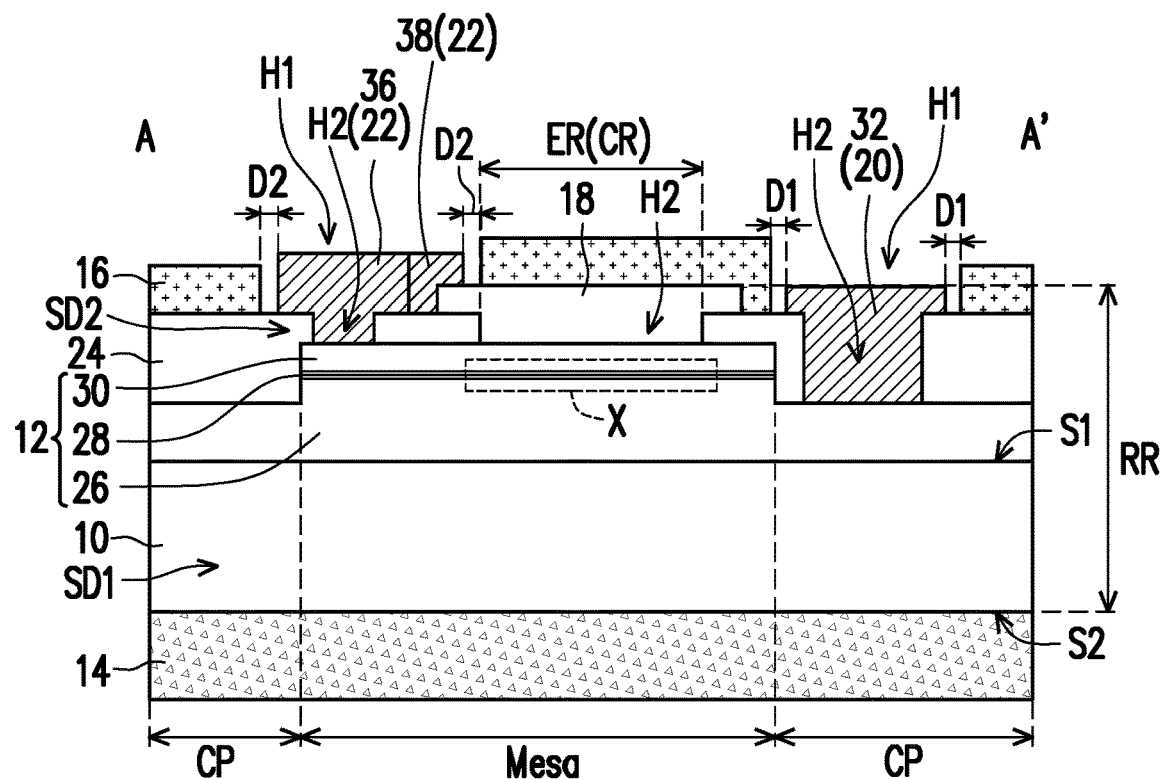
FIG. 1B and FIG. 1C are respectively schematic cross-sectional views along lines A-A' and B-B' in FIG. 1A.
Figure 1C:
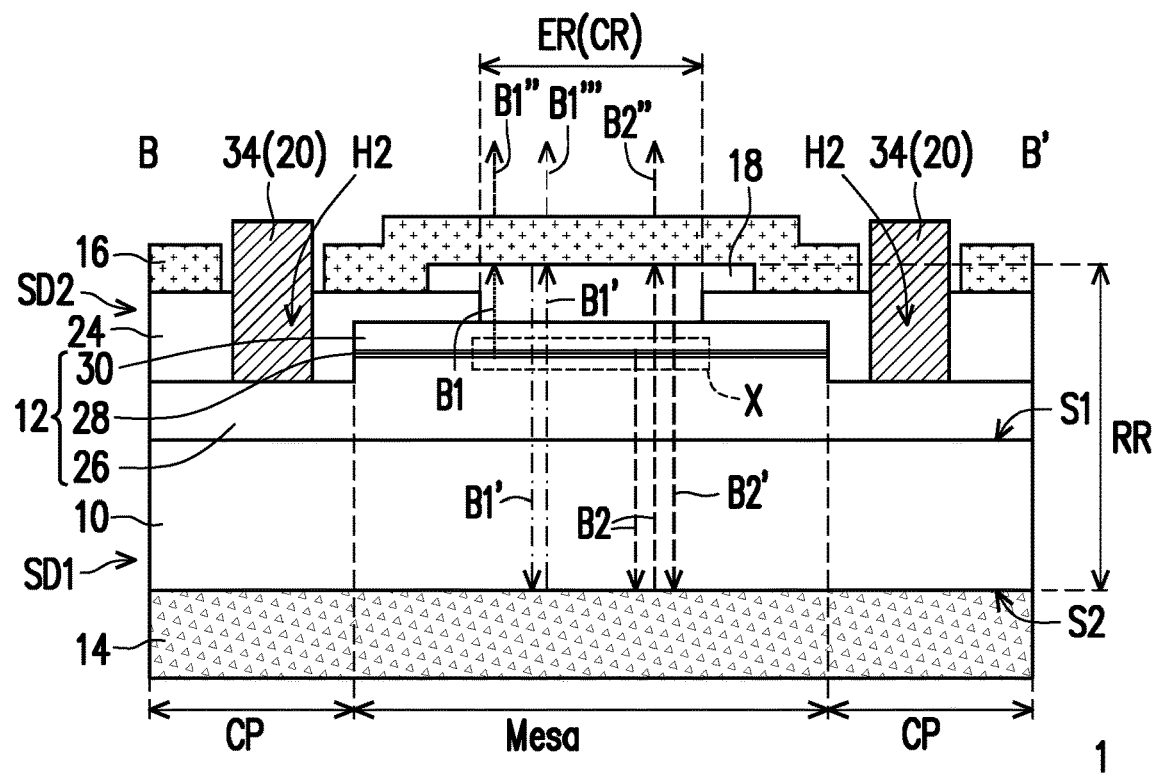

FIG. 1A is a top view showing a light emitting diode (LED) according to an embodiment of the invention. FIG. 1B and FIG. 1C are respectively schematic cross-sectional views along lines A-A' and B-B' in FIG. 1A. For illustrative clarity, a second reflective layer 16 is omitted from FIG. 1A.

Referring to FIG. 1A through FIG. 1C, in the present embodiment, an LED 1 includes a substrate 10, an epitaxial stacked layer 12, a first reflective layer 14, the second reflective layer 16, a current conducting layer 18, a first electrode 20, a second electrode 22 and a current blocking layer 24. The configuration relationship among the elements will be described in detail below.

The substrate 10 is, for example, a substrate adaptive for growing the epitaxial stacked layer 12, which may also be referred to as a growth substrate. The substrate 10 has a first and a second surfaces S1 and S2 opposite to each other and is, for example, a sapphire substrate, a gallium nitride (GaN) substrate, a gallium arsenide (GaAs) substrate or other substrates adaptive for growing the epitaxial stacked layer 12, but the invention is not limited thereto. In some embodiments, the first surface S1 of the substrate 10 is disposed with, for example, an unintentionally doped semiconductor layer serving as a nucleation layer or a buffer layer and is made of gallium arsenide (GaAs), gallium phosphide (GaP), aluminum indium gallium phosphide (AlInGaP), gallium nitride (GaN) or aluminum nitride, but the invention is not limited thereto. In some other embodiments, the unintentionally doped semiconductor layer may also be omitted from the substrate 10, but the invention is not limited thereto. In the present embodiment, the substrate 10 is a patterned substrate, which has, for example, a periodic pattern (not shown) disposed on the first surface S1 thereof and is, for example, a patterned sapphire substrate.

The epitaxial stacked layer 12 is disposed on the first surface S1 of the substrate 10 and includes a first-type semiconductor layer 26, an active layer 28 and a second-type semiconductor layer 30. The active layer 28 is disposed between the first-type semiconductor layer 26 and the second-type semiconductor layer 30. The first-type semiconductor layer 26 is in contact with the first surface S1 of the substrate 10. In detail, the epitaxial stacked layer 12 includes a mesa portion Mesa and a recess portion CP which is recessed with respect to the mesa portion Mesa. A part of the first-type semiconductor layer 26, the active layer 28 and the second-type semiconductor layer 30 define the mesa portion Mesa. The other part of the first-type semiconductor layer 26 defines the recess portion CP. The epitaxial stacked layer 12 has a first side SD1 adjacent to the first-type semiconductor layer 26 and a second side SD2 adjacent to the second-type semiconductor layer 30.

The first-type and the second-type semiconductor layers 26 and 30 are opposite to each other in the electrical property. Specifically, the first-type and the second-type semiconductor layers 26 and 30 are, for example, intrinsic semiconductors respectively in which N-type and P-type dopants are doped and respectively serve as an N-type and a P-type doped semiconductor layers, wherein materials used by the first-type and the second-type semiconductor layers 26 and 30 and the active layer 28 may include GaN, InGaN, GaP, AlInGaP or AlGaN, but the invention is not limited thereto. A structure of the active layer 28 is, for example, a multiple quantum well (MQW) formed by alternately stacking a plurality of well layers and a plurality of barrier layers or a single quantum well (SQW), but the invention is not limited thereto.

The first reflective layer 14 is, for example, a material layer with a reflection function and has a reflectivity greater than 98%. The first reflective layer 14 includes, for example, a distribute Bragg reflector (DBR), a metal layer or a combination formed by stacking the two, wherein the DBR is an optical stacked layer formed by stacking a plurality of layers with high and low refractive indexes that are periodically arranged. The metal layer is made of a metal material layer with a reflection function, for example, gold, nickel, chromium, aluminum, silver, copper, tin, a gold-beryllium (Au/Be) alloy, a gold-germanium (Au/Ge) alloy, a gold-tin (Au/Sn) alloy, a tin-silver copper (Sn/Ag/Cu) alloy, an aluminum-copper (Al/Cu) alloy or an arbitrary combination of the aforementioned materials, and the arbitrary combination includes forming a stacked layer, forming an alloy layer or forming a partially stacked layer and a partially alloy layer, but the invention is not limited thereto. The metal layer may be a part of a conductive path or may be electrically floating. The first reflective layer 14 is disposed at the first side SD1 of the epitaxial stacked layer 26 adjacent to the first-type semiconductor layer 26 and is in contact with the second surface S2 of the substrate 10.

A main light emitting surface is formed on the second reflective layer 16. The second reflective layer 16 is, for example, a material layer with a partial reflection and partial transmittance function, has a reflectivity greater than or equal to 90% and has a light transmittance greater than 0% and less than or equal to 10%. The second reflective layer 16 includes, for example, a DBR, a metal layer or a combination formed by stacking the two, wherein the DBR is an optical stacked layer formed by stacking a plurality of layers with high and low refractive indexes that are periodically arranged. The metal layer is made of a metal material layer with a reflection function, for example, gold, nickel, chromium, aluminum, silver, copper, tin, an Au/Be alloy, an Au/Ge alloy, an Au/Sn alloy, a Sn/Ag/Cu alloy, an Al/Cu alloy or an arbitrary combination of the aforementioned materials, wherein the arbitrary combination includes forming a stacked layer, forming an alloy layer or forming a partially stacked layer and a partially alloy layer, but the invention is not limited thereto. The metal layer may be a part of a conductive path or may be electrically floating. The second reflective layer 16 is disposed at the second side SD2 of the epitaxial stacked layer 30 adjacent to the second-type semiconductor layer 30 and is in contact with the current blocking layer 24 and the current conducting layer 18. The second reflective layer 16 has a plurality of first through holes H1, of which the number is two, for example, wherein one of the first through holes H1 overlaps the second-type semiconductor layer 30, and the other one of the first through holes H1 overlaps the first-type semiconductor layer 26, but does not overlap the second-type semiconductor layer 30.

In the present embodiment, the first reflective layer 14 and the second reflective layer 16 are slightly different, and the difference therebetween lies in a main light emitting surface formed on the second reflective layer 16. Thus, the first reflective layer 14 has a light transmittance greater than the second reflective layer 16, and the first reflective layer 14 is capable of reflecting most of light beams, while the second reflective layer 16 is capable of not only reflecting a part of the light beams, but also allowing a part of the light beams to transmit through the main light emitting surface. The difference in materials lies in that the number of the layers with high and low refractive indexes in the DBR used by the first reflective layer 14 is greater than the number of the layers with high and low refractive indexes in the DBR used by the second reflective layer 16. Additionally, the material of the first reflective layer 14 may also include a metal layer stacked on the DBR, or simply use the metal layer, while the second reflective layer 16 has the main light emitting surface and is mainly made of a DBR, but the invention is not limited thereto. In other embodiments of the invention, in case the main light emitting surface is formed on the first reflective layer 14, the light transmittance of the second reflective layer 16 is greater than the light transmittance of the first reflective layer 14, wherein the second reflective layer 16 is capable of reflecting most of the light beams, while the first reflective layer 14 is capable of not only reflecting a part of the light beams, but also allowing a part of the light beams to transmit through the main light emitting surface and vice versa, and in the occasion of the use of materials, vice versa. In other words, when an otter surface of one of the first reflective layer 14 and the second reflective layer 16 is used as the main light emitting surface, it allows a part of the light beams to transmit through, and that of the other one of the first reflective layer 14 and the second reflective layer 16 reflects most of the light beams back to the active layer.

The current conducting layer 18 (or referred as an ohmic contact layer) may be, for example, a layer of material which is capable of forming an ohmic contact on an interface with the second-type semiconductor layer 30, and the material comprises, for example, indium tin oxide (ITO), an nickel-gold (Ni/Au) alloy, an Au/Be alloy, an Au/Ge or other suitable metals or alloys, but the invention is not limited thereto. The current conducting layer 18 is disposed on the second-type semiconductor layer 30 and the current blocking layer 24 of the mesa portion Mesa and is in contact with the second-type semiconductor layer 30 and the current blocking layer 24.

The first and the second electrodes 20 and 22 are made of metal materials which are selected from Cr, Al, Ti, Ni, Pt, Au, an Al/Cu alloy, an Au/Sn alloy, a Sn/Ag/Cu alloy or combinations thereof, but the invention is not limited thereto. The first electrode 20 is disposed on the first-type semiconductor layer 26 of the recess portion CP and is in contact with the first-type semiconductor layer 26 to be electrically connected thereto. The second electrode 22 is disposed on the second-type semiconductor layer 30 of the mesa portion Mesa and is electrically connected to the second-type semiconductor layer 30 via the current conducting layer 18. The first electrode 20 overlaps the recess portion CP, and the second electrode 22 overlaps the mesa portion Mesa. A first distance D1 is configured between the first electrode 20 and the second reflective layer 16, and a second distance D2 is configured between the second electrode 22 and the second reflective layer 16. When the first and the second electrodes 20 and 22 are connected to an external power supply through a wire-bonding process, the second reflective layer 16 may be prevented from being damaged by the bonding process in the presence of the design of the distances D1 and D2.

In the embodiments of the invention, at least one of the first and the second electrodes 20 and 22 includes a welding portion and at least one finger portion extended from the welding portion. Referring to FIG. 1A and FIG. 1B, in the present embodiment, the first electrode 20 includes a first welding portion 32 and at least one first finger portion 34 extended from the first welding portion 32. The second electrode 22 also includes a second welding portion 36 and at least one second finger portion 38 extended from the second welding portion 36. In the present embodiment, both the numbers of the first and the second finger portions 34 and 38 are, for example, two, but the invention is not limited thereto. The first finger portions 34 are extended toward an edge E1 of the LED 1, and the second finger portions 38 are extended toward the other edge E2 of the LED 1, wherein the edges E1 and E2 are opposite to each other. Referring to FIG. 1B, the second welding portion 36 is in contact with the second-type semiconductor layer 30, a Schottky contact is formed on an interface therebetween, and thus, a current (or an electron flow) has a very small chance flowing on the interface therebetween. The second finger portions 38 are in contact with the current conducting layer 18. Additionally, the current conducting layer 18 is in contact with the second-type semiconductor layer 30, an interface therebetween also forms an ohmic contact, and thus, most of the current (or the electron flow) flows through the interface. Moreover, it should be noted that in the present embodiment, both the first and the second electrodes are designed with the welding portions and the finger portions, however, in other embodiments, it may also be a design that one of the first and the second electrodes has the welding portion and the finger portion, while the other one does not, but the invention is not limited thereto.

The current blocking layer 24 is, for example, a material layer having a high resistance value for blocking the current from passing through a location where it is disposed. In the present embodiment, the dielectric layer 24 may be made of, for example, a dielectric material, such as silicon oxide (SiOx), silicon nitride (SiNx), titanium oxide (TiOx), a DBR (i.e., an optical stacked layer formed by stacking a plurality of layers with high and low refractive indexes that are periodically arranged), but the invention is not limited thereto. Referring to FIG. 1B, the current blocking layer 24 is, for example, a patterned current blocking layer and has at least one second through hole H2. The at least one second through hole H2 exposes a part of the epitaxial stacked layer 12. In the present embodiment, the number of the at least one second through hole H2 is, for example, 3, but the invention is not limited thereto. The two second through holes H2 disposed at the left in FIG. 1B exposes a part of the second-type semiconductor layer 30, and the second through hole H2 disposed at the right in FIG. 1B exposes a part of the first-type semiconductor layer 26. The second welding portion 36 of the second electrode 22 is extended into the leftmost second through hole H2 to be in contact with the second-type semiconductor layer 30, the current conducting layer 18 is extended into the second through hole H2 in the middle to be in contact with the second-type semiconductor layer 30, and the first welding portion 32 of the first electrode 20 is extended into the rightmost second through hole H2 to be in contact with the second-type semiconductor layer 26.

Referring again to FIG. 1A through FIG. 1C, a type of the LED 1 is a horizontal-type LED, i.e., both the first and the second electrodes 20 and 22 are disposed at the second side SD2 of the epitaxial stacked layer 12, and thus, the current substantially flows horizontally in a transmission path between the first and the second electrodes 20 and 22.

An optical effect of the LED 1 will be described in detail below.

Referring to FIG. 1A through FIG. 1C, in the LED 1 of the present embodiment, since the second electrode 22 is electrically connected to the second-type semiconductor layer 30 via the current conducting layer 18, and an interface between the current conducting layer 18 and the second-type semiconductor layer 30 forms an ohmic contact, most of the current (or the electron flow) flows through a contact scope CR of the current conducting layer 18 and the second-type semiconductor layer 30, and is transmitted to a part of the active layer 28 which overlaps the contact scope CR, an electric hole and the electron are bonded together in this part of the active layer 28 to emit light. A region where the part of the active layer 28 is located is also referred to as an electron-electric hole binding region X (as illustrated in FIG. 1B and FIG. 1C), and a scope of the electron-electric hole binding region X is slightly larger than a light-emitting scope ER. Thus, the contact scope CR of the current conducting layer 18 and the second-type semiconductor layer 30 is also served as an light-emitting scope ER of the LED 1, and a shape of the light-emitting scope ER is, for example, a circular shape, an arc shape or any other shape, but the invention is not limited thereto. Additionally, the light-emitting scope ER overlaps the first and the second reflective layers 14 and 16, but does not overlap the first and the second electrodes 20 and 22. Moreover, in other embodiments that are not shown, the light-emitting scopes ER may also be multiple, for example, and a distance is configured between two adjacent light-emitting scopes ER.

For clarity, the optical behavior of the LED 1 is only illustrated in FIG. 1C, but omitted from FIG. 1B. There are two initial emitting directions of light beams emitted from the electron-electric hole binding region X, in which one of the light beam directly emitted to the second reflective layer 16 is labeled as B1, and the other one of the light beam directly emitted to the first reflective layer 14 is labeled as B2. The optical behavior is discussed according to different light beams B1 and B2 below.

Based on the above, since the light-emitting scope ER overlaps the first and the second reflective layers 14 and 16, the light beam B1 is transmitted upwards to the second reflective layer 16, a part BF of the light beam B1 is reflected by the second reflective layer 16 and transmitted to the first reflective layer 14, the other part B1" of the light beam B1 is transmitted through the second reflective layer 16 to be emitted from the LED 1. Then, the light beam B1' is again reflected by the first reflective layer 14 with the high reflectivity back to the second reflective layer 16, a part B1' of the light beam B1' (not shown) is reflected by the second reflective layer 16 back to the first reflective layer 14 to again perform the aforementioned optical behavior, and a part B1'" of the light beam B1" is transmitted through the second reflective layer 16 to be emitted from the LED 1.

Similarly, the light beam B2 is transmitted downwards to the first reflective layer 14 and is reflected by the first reflective layer 14 with the high reflectivity to the second reflective layer 16, a part B2' of the light beam B2 is reflected by the second reflective layer 16 back to the first reflective layer 14, the other part B2" of the light beam B2 is transmitted through the second reflective layer 16 to be emitted from the LED 1, and the subsequent optical behavior is similar to that described above, which will not be repeatedly described.

An effect similar to a laser resonant cavity is generated by the light beams between the first and the second reflective layers 14 and 16, and an region between the first and the second reflective layers 14 and 16 may also referred to as a resonant region RR. Moreover, there are also some light beams (not shown) obliquely emitted from the electron-electric hole binding region X, and the light beams after being totally reflected between the first and the second reflective layers one or more times 14 and 16 and between the first electrode 20 and the second electrode 22 may emit light within the light-emitting scope ER.

In addition, since the light-emitting scope ER is the contact scope CR defined by the current conducting layer 18 and the second-type semiconductor layer 30, and the light-emitting scope ER does not overlap the first and the second electrodes 20 and 22, a light-emitting angle of the LED 1 may be significantly reduced. Thus, the LED 1 of the present embodiment may have high directivity and be suitable for serving as a light source for an optic fiber communication transceiver module.

It should be noted that the description related to the same elements may be inferred with reference to parts of the foregoing embodiment and will not be repeated in the embodiment below.

Figure 2:
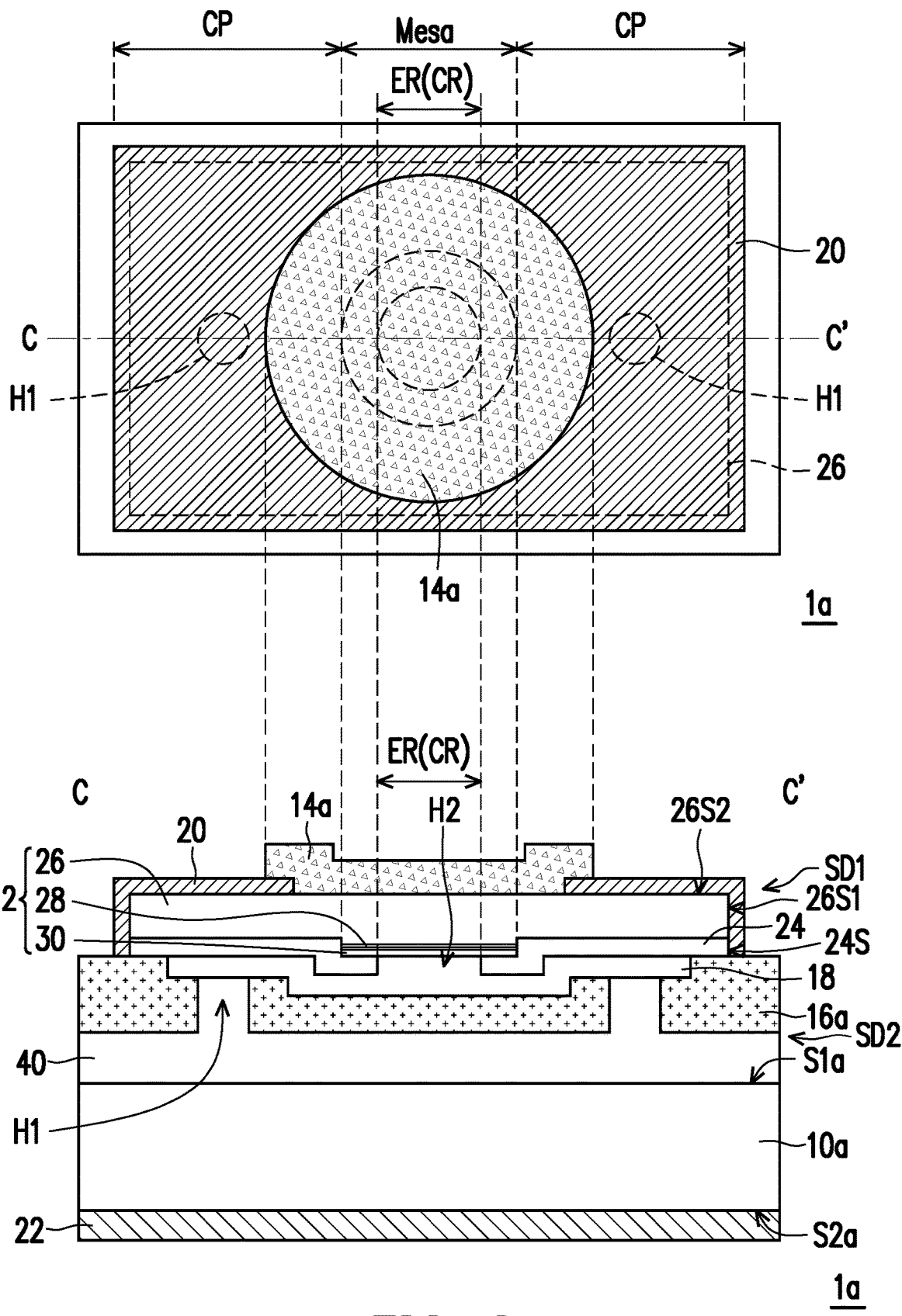
FIG. 2 is a schematic top view and a cross-sectional view showing an LED according to another embodiment of the invention.

FIG. 2 is a schematic top view and a cross-sectional view showing an LED according to another embodiment of the invention.

Referring to FIG. 2, an LED 1a illustrated in FIG. 2 is substantially similar to the LED 1 illustrated in FIG. 1A through FIG. 1C and is mainly different therefrom in that the LED 1a is a vertical-type LED. In detail, in the LED 1a, a substrate 10a is, for example, a conductive substrate and has a first and a second surfaces S1a and S2a which are opposite to each other and are silicon carbide substrates or silicon substrates, for example, but the invention is not limited thereto. The first electrode 20 and the second electrode 22 are respectively formed at the first and the second sides SD1 and SD2 of the epitaxial stacked layer 12. More specifically, the first electrode 20 covers a lateral surface 26S1 and a bottom surface 26S2 of the first-type semiconductor layer 26 and a lateral surface of the current blocking layer 24. The second electrode 22 is disposed on the second surface S2a of the substrate 10a. The number of the at least one second through hole H2 of the current blocking layer 24 is, for example, one, but the invention is not limited thereto.

Moreover, in the present embodiment, a second reflective layer 16a has a higher reflectivity than a first reflective layer 14a and is capable of reflecting most of the light beams, while the first reflective layer 14a is capable of not only reflecting a part of the light beam, but also allowing a part of the light beam to transmit through the main light emitting surface. The difference in materials lies in that the number of the layers with high and low refractive indexes in the DBR used by the second reflective layer 16a is greater than the number of the layers with high and low refractive indexes in the DBR used by the second reflective layer 16a, but the invention is not limited thereto. A scope that the current conducting layer 18 is in contact with the second-type semiconductor layer 30 is also served as a light-emitting scope ER (CR) of an LED 1a, a shape of the light-emitting scope ER is, for example, a circular shape, an arc shape or any other shape, and its number, location and shape may also be defined by a manufacturing process of the current conducting layer 18. In the present embodiment, the light-emitting scopes ER has a number of, for example, one. In other embodiments that are not shown, the light-emitting scope ER may also be multiple, and there is a distance between two adjacent light-emitting scopes ER, but the invention is not limited thereto. Additionally, the light-emitting scope ER overlaps the first and the second reflective layers 14a and 16a.

Referring to FIG. 2 again, the first reflective layer 14a has a plurality of first through holes H1, and the first through holes H1 overlap the first-type semiconductor layer 26, but do not overlap the second-type semiconductor layer 30. In another viewpoint, the first through holes H1 overlap the recess portion CP. Moreover, the LED 1a further includes a bonding layer 40, which is made of, for example, a conductive adhesive (i.e., a material mixed with an adhesive and metal particles, including, but not limited to, a silver glue or an anisotropic conductive paste), Cr, Al, Ti, Ni, Pt, Au, a Cu/Al alloy, an Au/Sn alloy, a Sn/Ag/Cu alloy or a solder paste. The bonding layer 40 is disposed between the first reflective layer 14a and the substrate 10a and is extended into the first through holes H1 to be in contact with the current conducting layer 18. The lateral surface of the conductive substrate 10a, a lateral surface of the bonding layer 40, a lateral surface of the second reflective layer 16a form a substantially planar lateral surface.

Referring to FIG. 2 again, a type of the LED 1a is a vertical-type LED, i.e., the first and the second electrodes 20 and 22 are respectively disposed at the first and the second sides SD1 and SD2 of the epitaxial stacked layer 12, and thus, the current substantially flows vertically in a transmission path between the first and the second electrodes 20 and 22.

Based on the above, the optical behavior of the LED 1a is substantially similar to that of the LED 1 illustrated in FIG. 1A through FIG. 1C and is mainly different therefrom in that the light beams (not shown) after being emitted from the active layer 28, are mainly reflected by the second reflective layer 16a with the high reflectivity, and the light beams are partially transmitted through the first reflective layer 14a and partially reflected by the first reflective layer 14a, i.e., the light beams, after being reflected between the first and the second reflective layers one or more times 14a and 16a, are emitted from the first reflective layer 14a adjacent to the first-type semiconductor layer 26. In comparison with the LED 1 illustrated in FIG. 1A through FIG.

1C, the light beams, after being reflected between the first and the second reflective layers one or more times 14a and 16a, are emitted from the second reflective layer 16 adjacent to the second-type semiconductor layer 30.

Moreover, it should be noted that in the LED 1a, the substrate 10a as used is, for example, a conductive substrate. However, in other embodiments, the substrate 10a may also use a non-conductive substrate (e.g., a sapphire substrate), while a conductive wire (not shown) is also additionally disposed to bypass the non-conductive substrate 10a to connect the lateral surface of the bonding layer 40 and the second electrode 22, and the current still substantially flows vertically in a transmission path between the first and the second electrodes 20 and 22.

Figure 3:
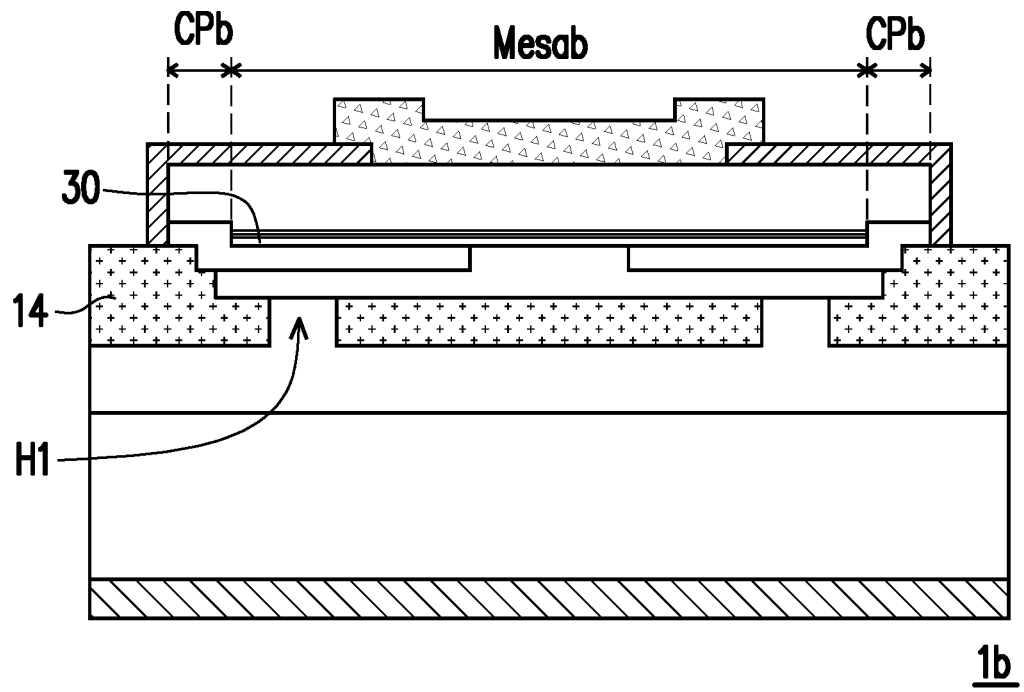
FIG. 3 through FIG. 5 are schematic cross-sectional views of LEDs according to different embodiments of the invention.
Figure 4:
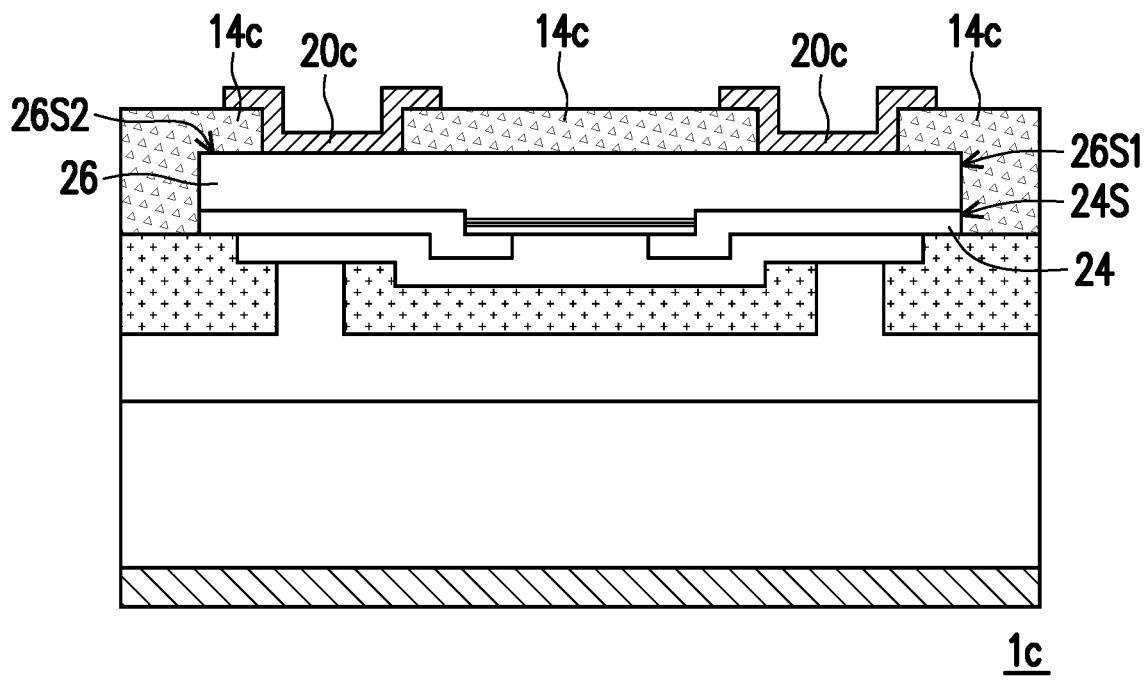
Figure 5:
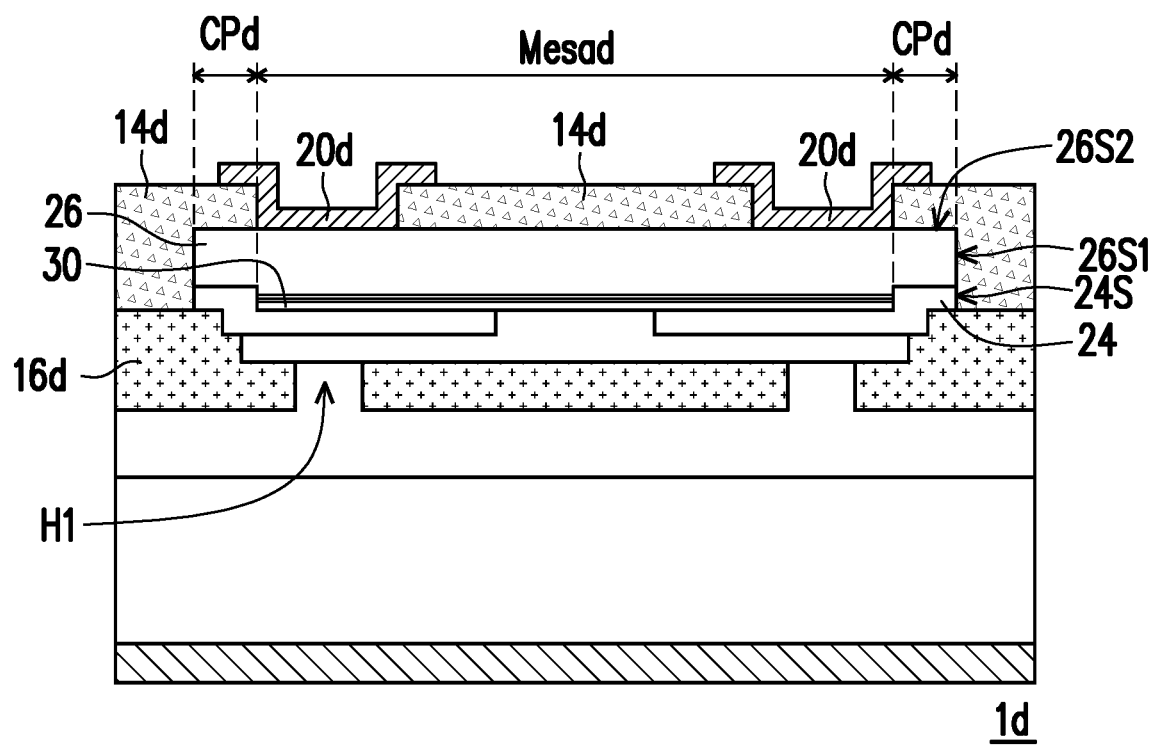

FIG. 3 through FIG. 5 are schematic cross-sectional views of LEDs according to different embodiments of the invention. It should be noted that LEDs illustrated in FIG. 3 through FIG. 5 are substantially the same as the LED 1a illustrated in FIG. 2, and only the difference and parts requires to be described are labeled in FIG. 3 through FIG. 5, while the other parts may refer to the labeling numerals in FIG. 2.

Referring to FIG. 3, an LED 1b illustrated in FIG. 3 is substantially similar to the LED 1a illustrated in FIG. 2, and the mainly difference lies in that a mesa portion Mesab has a greater scope, and a recess portion CPb has a smaller scope. The plurality of first through holes H1 of the second reflective layer 16 overlap the mesa portion Mesab, i.e., the first through holes H1 overlap the second-type semiconductor layer 30.

Referring to FIG. 4, an LED 1c illustrated in FIG. 4 is substantially similar to the LED 1a illustrated in FIG. 2, and the mainly difference lies in that a second electrode 22c only covers the bottom surface 26S2 of the first-type semiconductor layer 26. Moreover, a first reflective layer 14c covers a part of the bottom surface 26S2 and the lateral surface 26S1 of the first-type semiconductor layer 26 and a lateral surface 24S of the current blocking layer 24.

Referring to FIG. 5, an LED 1d illustrated in FIG. 5 is substantially similar to the LED 1a illustrated in FIG. 2, and the mainly difference lies in that a second electrode 22d only covers the bottom surface 26S2 of the first-type semiconductor layer 26. Moreover, a first reflective layer 14d covers a part of the bottom surface 26S2 and the lateral surface 26S1 of the first-type semiconductor layer 26 and the lateral surface 24S of the current blocking layer 24. In addition, a mesa portion Mesad has a greater scope, and a recess portion CPd has a smaller scope. A plurality of first through holes H1 of a second reflective layer 16d overlap the mesa portion Mesad, i.e., the first through holes H1 overlap the second-type semiconductor layer 30.

Manufacturing methods of the LED 1 illustrated in FIG. 1A through FIG. 1C and the LED 1a illustrated in FIG. 2A through FIG. 2B are respectively described with reference to FIG. 6A through FIG. 6H and FIG. 7A through FIG. 7H below.

Figure 6A:
FIG. 6A through FIG. 6H are schematic cross-sectional views showing a process of manufacturing the LED depicted in FIG. 1A through FIG. 1C.

First, Referring to FIG. 6A, a substrate 10 is provided, and a cleaning operation is performed on a surface of the substrate 10.

Figure 6B:
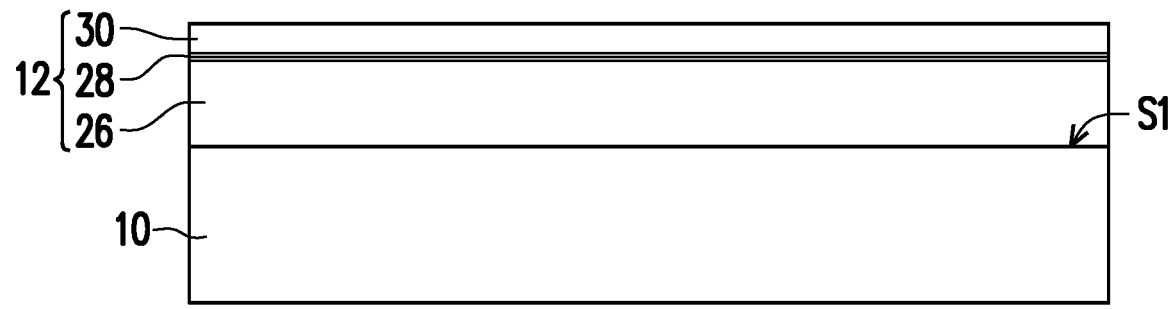

Referring to FIG. 6B, an epitaxial stacked layer 12 is formed on a first surface S1 of the substrate 10, wherein the epitaxial stacked layer 12 includes a first-type semiconductor layer 26, an active layer 28 and a second-type semiconductor layer 30. In other words, the first-type semiconductor layer 26, the active layer 28 and the second-type semiconductor layer 30 are sequentially formed on the substrate 10 in the specific step illustrated in FIG. 6B. A method of growing the epitaxial stacked layer 12 includes, for example, a metal organic chemical-vapor deposition (MOCVD) method, a physical vapor deposition (PVD) method, a chemical vapor deposition (CVD) method, a sputtering deposition method or other suitable epitaxial-related processes, which is not limited in the invention.

Figure 6C:
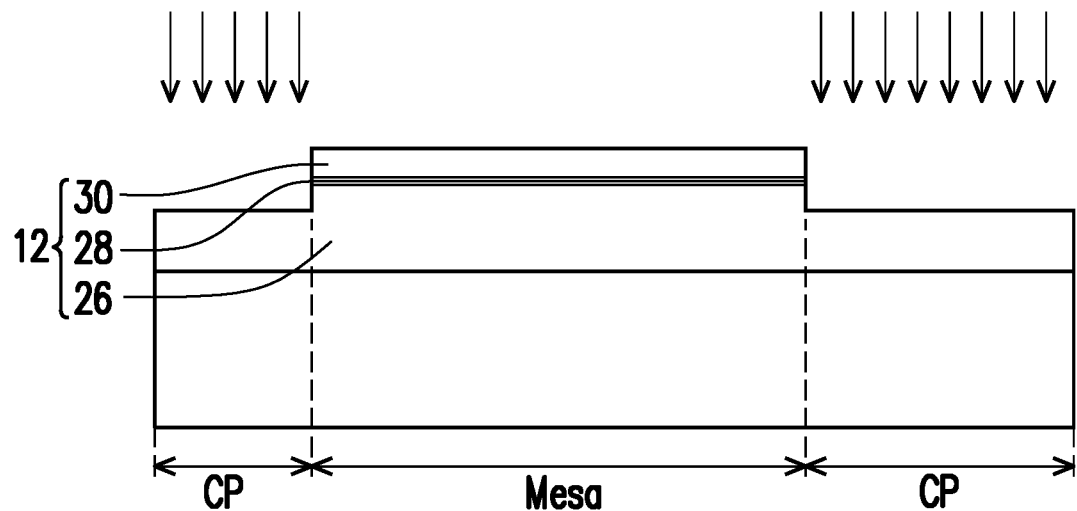

Referring to FIG. 6C, the epitaxial stacked layer 12 is etched to remove a part of the second-type semiconductor layer 30, a part of the active layer 28 and a part of the first-type semiconductor layer 26 to expose a part of the first-type semiconductor layer 26, thereby forming a mesa portion Mesa and a recess portion CP. A method of the etching includes, for example, dry chemical etching, wet chemical etching, physical etching or a combination of the aforementioned three types of etching, but the invention is not limited thereto.

Figure 6D:
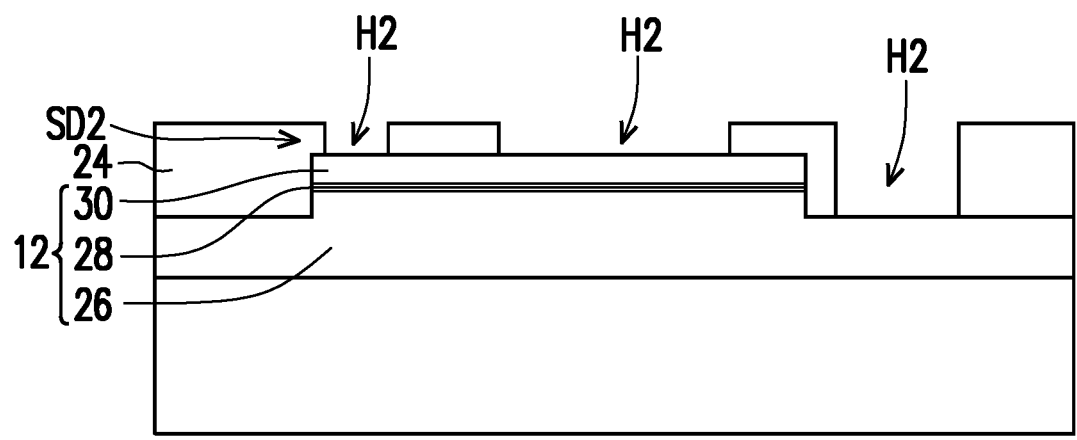

Referring to FIG. 6D, a current blocking layer 24 is formed on the epitaxial stacked layer 12, wherein a method of forming the current blocking layer 24 includes a lift-off process. In detail, a photoresist layer (not shown) is first applied on the epitaxial stacked layer 12. Then, a part of regions of the photoresist layer are exposed and developed to remove the part of the regions of the photoresist layer. Thereafter, the current blocking layer 24 is deposited on the developed photoresist layer, such that the current blocking layer 24 is deposited on the part of the regions on the developed photoresist layer and exposed due to the photoresist layer thereof being removed. Finally, the photoresist layer is removed, and thus, a part of the current blocking layer deposited on the photoresist layer is removed as the photoresist layer is removed, thereby forming a current blocking layer 24 (or referred to as a patterned current blocking layer) having at least one second through hole H2. The dielectric layer 24 may be made of, for example, a dielectric material, such as SiOx, SiNx, TiOx, a DBR (i.e., an optical stacked layer formed by stacking a plurality of layers with high and low refractive indexes that are periodically arranged).

Figure 6E:
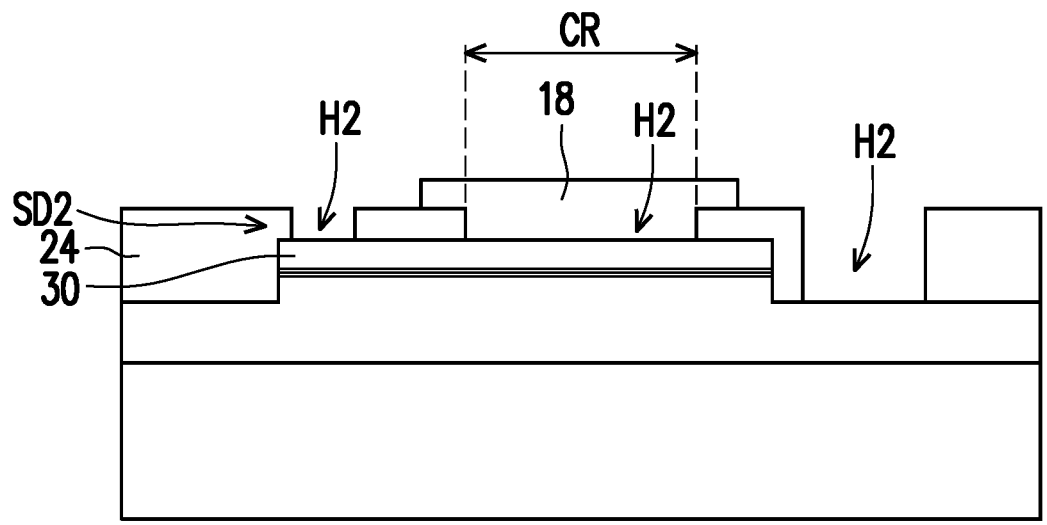

Referring to FIG. 6E, a current conducting layer 18 is formed on the current blocking layer 24 and the second-type semiconductor layer 30, and the current conducting layer 18 is filled in a part of the second through holes H2 to be in contact with the second-type semiconductor layer 30, wherein a region that the current conducting layer 18 is in contact with the second-type semiconductor layer 30 is labeled as CR, and the contact region CR is, for example, the light-emitting scope ER as referred to in the embodiments above.

Figure 6F:
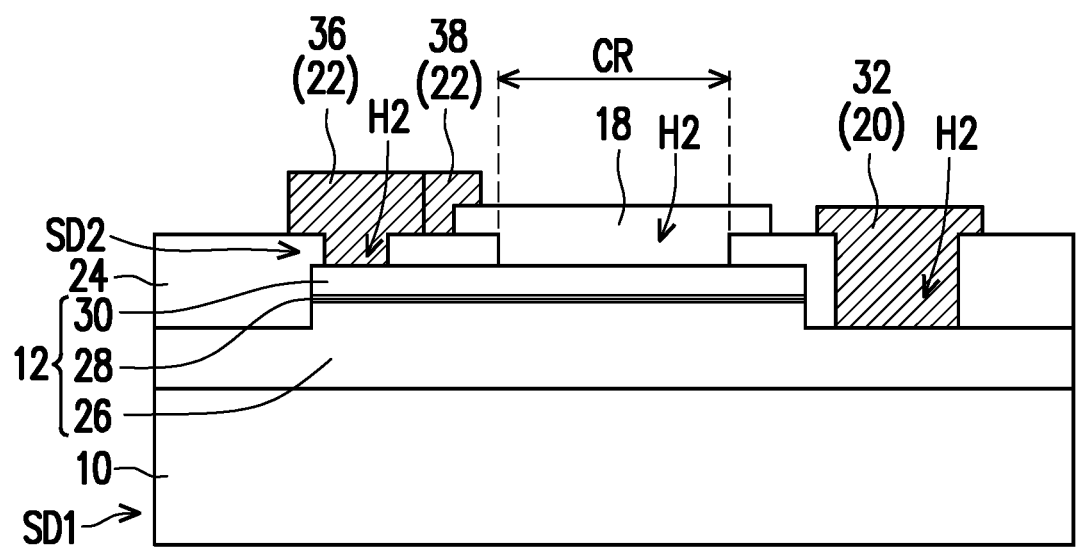

Referring to FIG. 6F, a first and a second electrodes 20 and 22 are formed on the epitaxial stacked layer 12, wherein a method of forming the first and the second electrodes 20 and 22 is also a lift-off process, a process thereof is substantially similar to that described above and thus, will not be repeated. An electrode material of the first electrode 20 is filled in a part of the second through holes H2 to be in contact with the first-type semiconductor layer 26, and an electrode material of the second electrode 22 is filled in a part of the second through holes H2 to be in contact with the second-type semiconductor layer 30. The second electrode 22 also includes a second welding portion 36 and at least one second finger portion 38 extended from the second welding portion 36. A first welding portion 32 is disposed on a part of the current blocking layer 24 and a part of the second-type semiconductor layer 30, and the second finger portion 38 is in contact with the current conducting layer 18. Additionally, the current conducting layer 18 is in contact with the second-type semiconductor layer 30, an interface therebetween also forms an ohmic contact, and the second electrode 22 is electrically connected to the second-type semiconductor layer 30 via the second finger portion 38 and the current conducting layer 18.

Figure 6G:
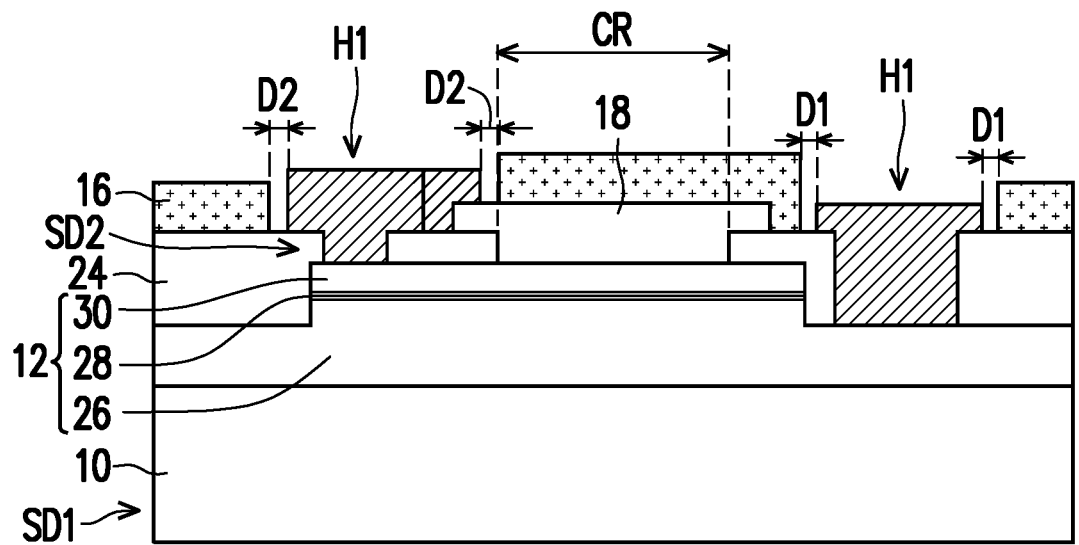

Referring to FIG. 6G, a second reflective layer 16 is formed at a second side SD2 of the epitaxial stacked layer 12. The second reflective layer 16 covers the current blocking layer 24 and the current conducting layer 18, and at least a part of the second reflective layer 16 overlaps the contact region CR. A method of forming the second reflective layer 16 is also a lift-off process and thus, will not be repeated. The second reflective layer 16 has a plurality of first through holes H1 respectively configured with a first and a second distances D1 and D2 from the first and the second electrodes 20 and 22.

Figure 6H:
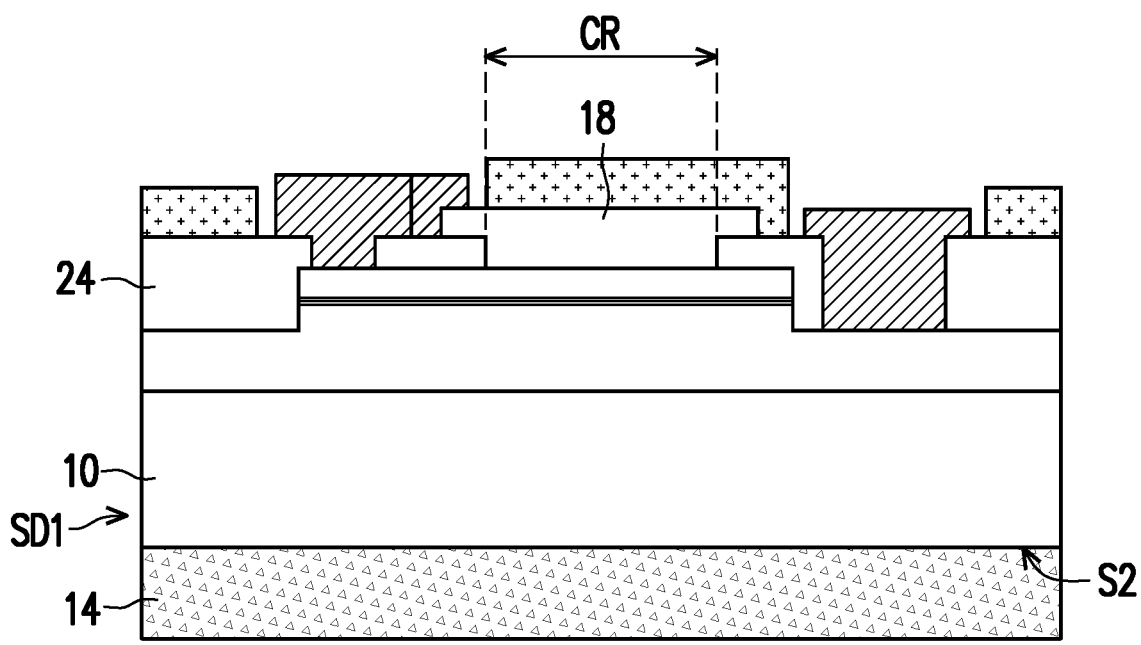

Referring to FIG. 6H, a first reflective layer 14 is formed at a first side SD1 of the epitaxial stacked layer 12 and is, for example, formed on a second surface S2 of the substrate 10. The first reflective layer 14 covers the current blocking layer 24 and the current conducting layer 18, and at least a part of the first reflective layer 14 overlaps the contact region CR.

As such, the manufacturing of the LED 1 illustrated in FIG. 1A through FIG. 1C is substantially completed.

Then, a manufacturing process of the LED 1a illustrated in FIG. 2A through FIG. 2B is introduced.

Referring to FIG. 7A through FIG. 7E, the steps illustrated therein are respectively similar to those illustrated in FIG. 6A through FIG. 6E and thus, will not be repeated.

Figure 7A:
FIG. 7A through FIG. 7M are schematic cross-sectional views showing a process of manufacturing the LED depicted in FIG. 2.
Figure 7B:
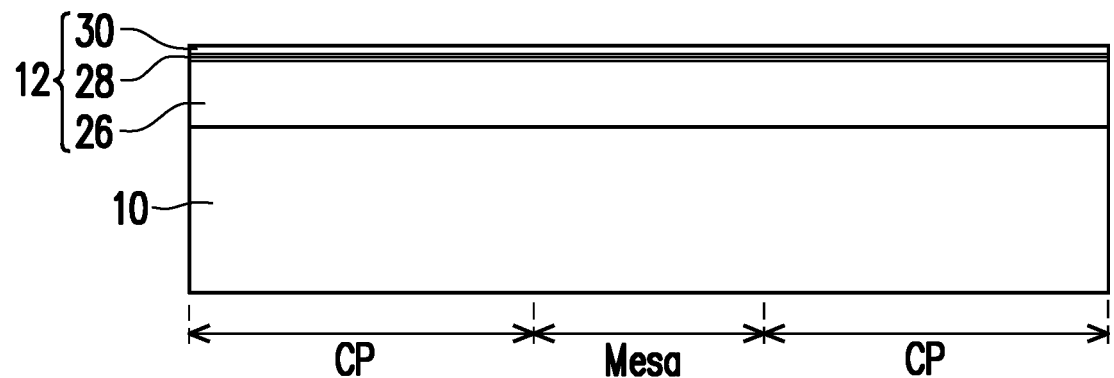
Figure 7C:
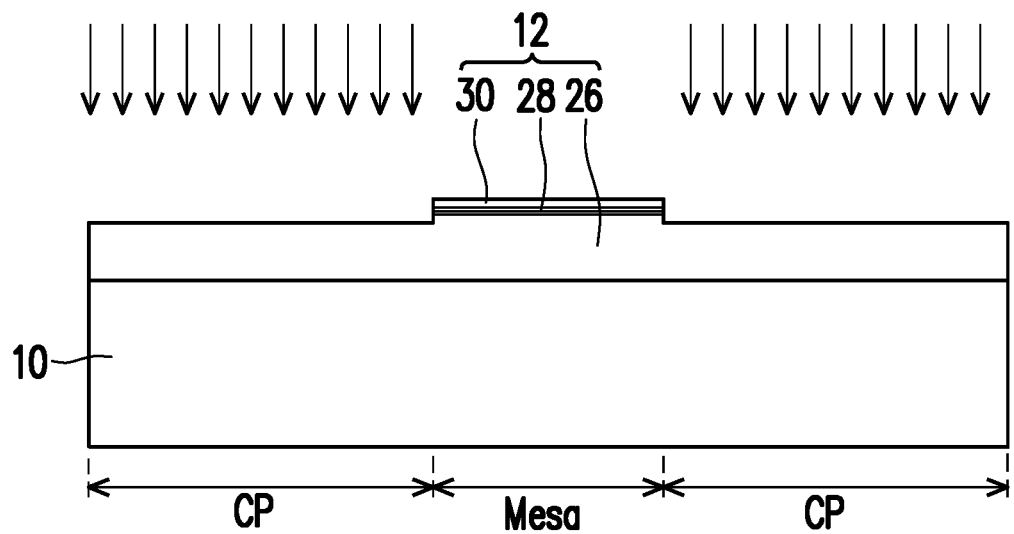
Figure 7D:
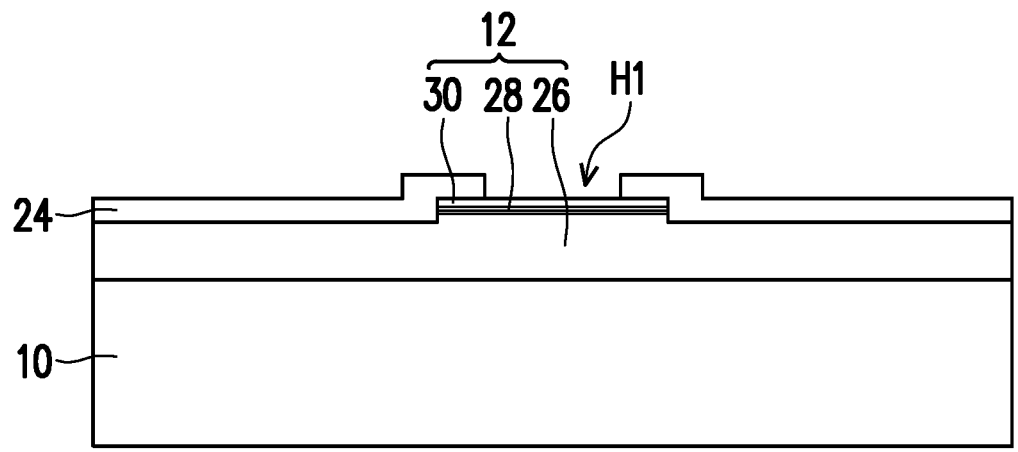
Figure 7E:
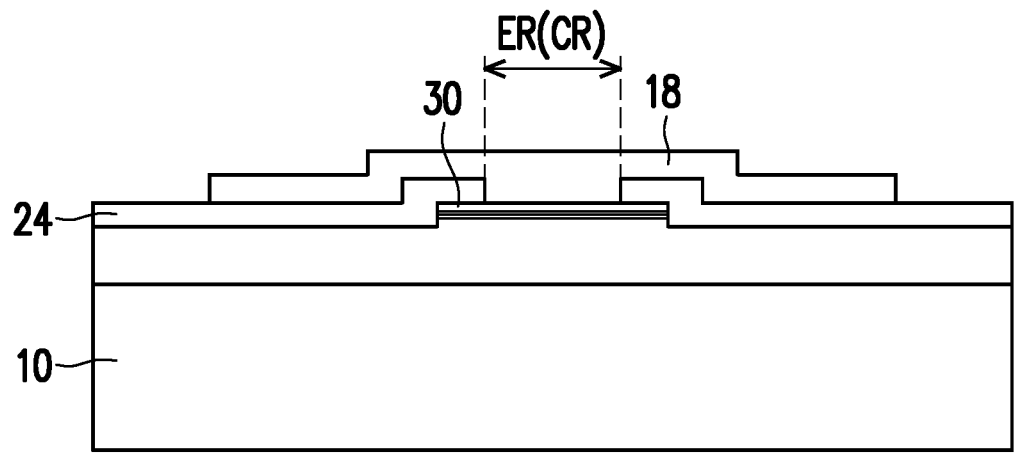
Figure 7F:
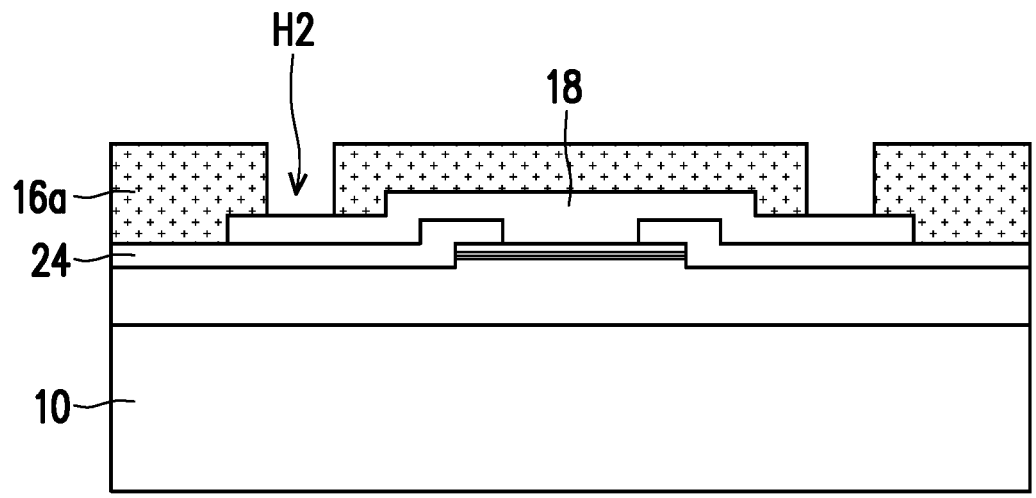

Referring to FIG. 7F, a second reflective layer 16a is formed on the current conducting layer 18 and the current blocking layer 24, wherein the second reflective layer 16a has a plurality of first through holes H1. A method of forming the second reflective layer 16a is also a lift-off process and thus, will not be repeated.

Figure 7G:
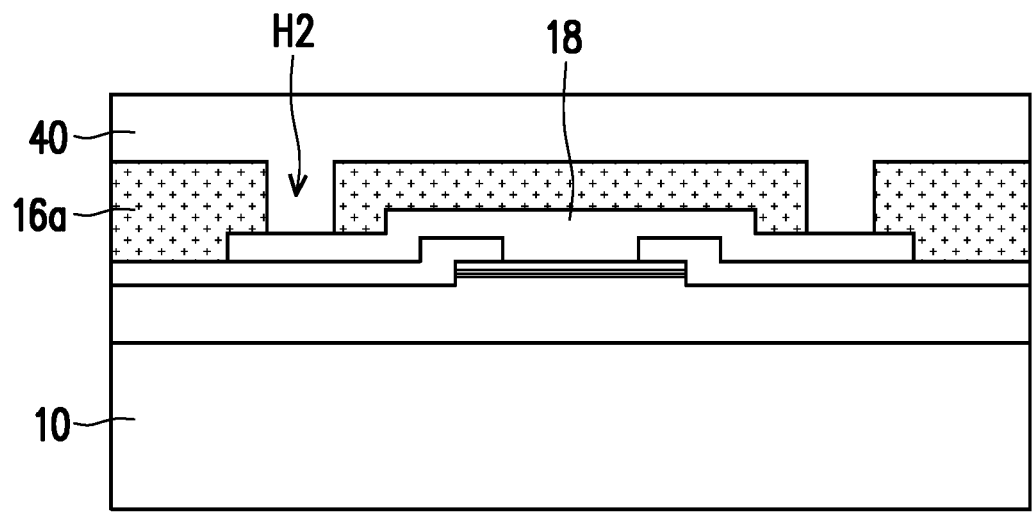

Referring to FIG. 7G, a bonding layer 40 is formed on the second reflective layer 16a, wherein a material of the bonding layer 40 is filled in a part of the first through holes H1 to be in contact with the current conducting layer 18.

Figure 7H:

Referring to FIG. 7H, another substrate 10a is provided, wherein the substrate 10a is, for example, a conductive substrate, and a cleaning operation is performed on a surface of the substrate 10a.

Figure 7I:
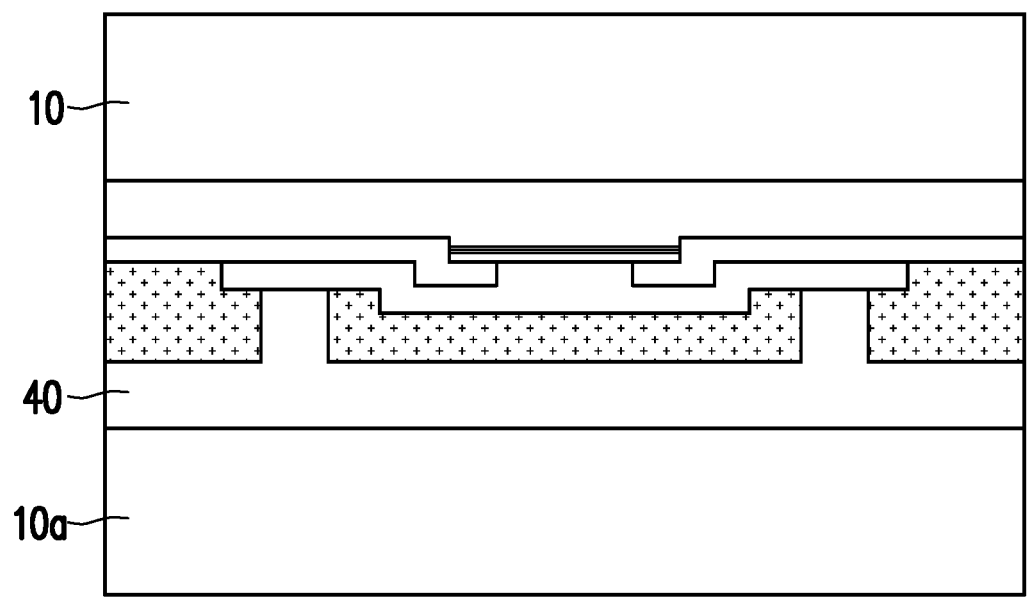

Referring to FIG. 7I the bonding layer 40 is bonded to a top surface of the substrate 10a. Along with a transfer process, the aforementioned elements are transferred onto the substrate 10a.

Figure 7J:
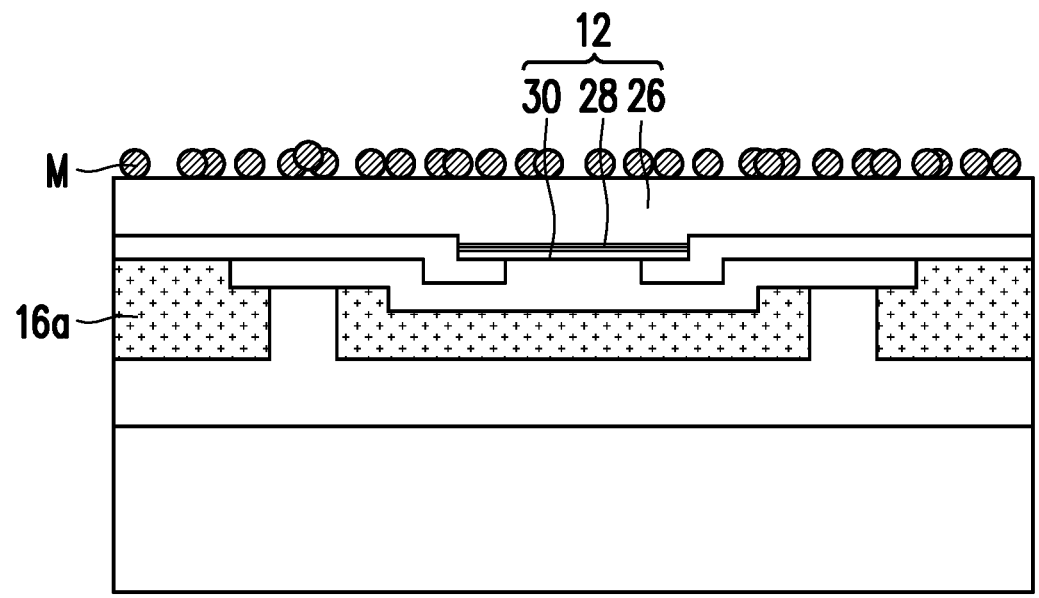

Referring to FIG. 7J, the substrate 10 is removed. A method of removing the substrate 10 is, for example, a physical or a chemical etching method, but the invention is not limited thereto. The substrate 10 is also referred to as a temporary substrate. In the present embodiment, the method of removing the substrate 10 includes a laser lift-off process. During the process that the laser lift-off process is performed, a high temperature of the laser may reduce metal ions in the epitaxial stacked layer 12 into a metal M. Thus, the etching process, for example, a wet chemical etching process, may further be performed on a surface of the epitaxial stacked layer 12 after the laser lift-off process to remove the metal, e.g., a gallium metal. Then, the metal M is further removed by a physical or a chemical etching method.

Figure 7K:
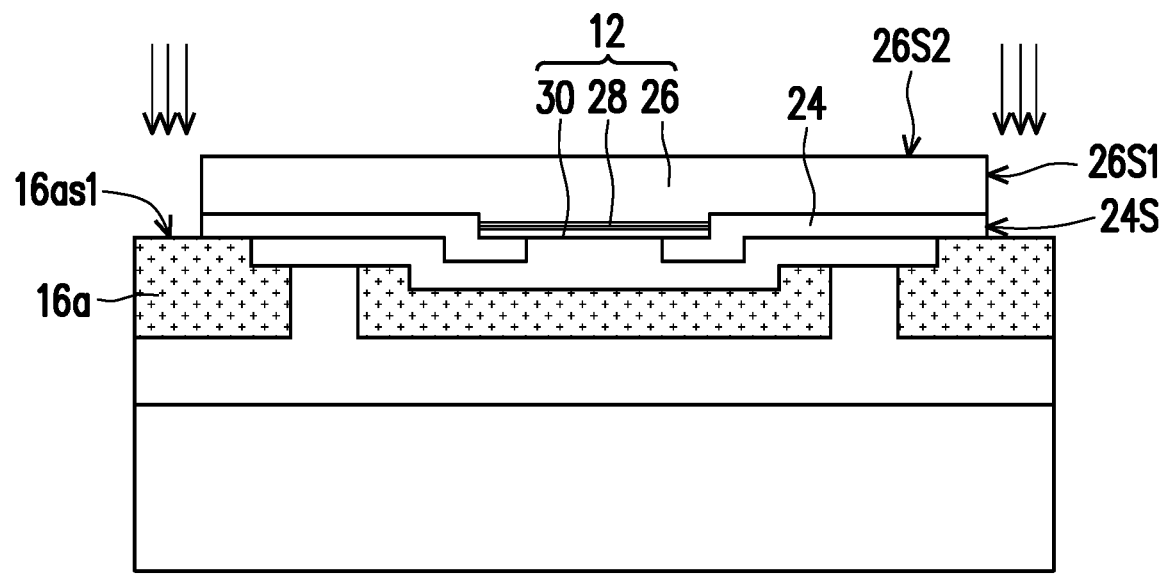

Referring to FIG. 7K, a part of the first-type semiconductor layer 26, the active layer 28 and the second-type semiconductor layer 30 are etched to expose the lateral surface 26S1 of the first-type semiconductor layer 26, the lateral surface 24S1 of the current blocking layer 24 and a top surface 16aS1 of the second reflective layer 16a.

Figure 7L:
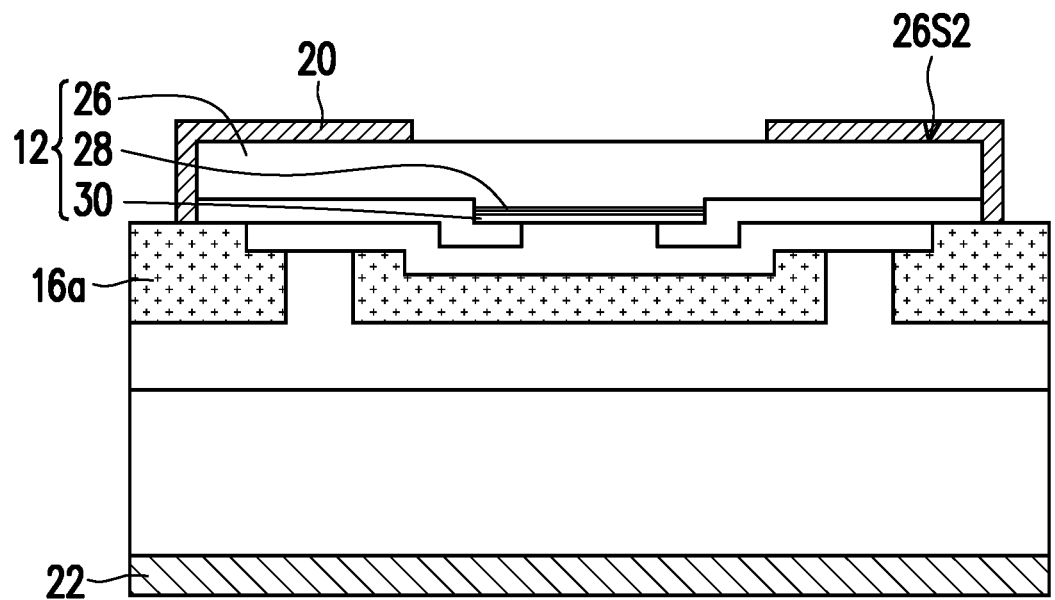

Referring to FIG. 7L, the second electrode 22 is formed on the epitaxial stacked layer 12 and the second reflective layer 16 to cover the bottom surface 26S2 and the lateral surface 26S1 of the first-type semiconductor layer 26 and the lateral surface 24S of the current blocking layer 24. Additionally, the first electrode 20 is also formed on the substrate 10a.

Figure 7M:
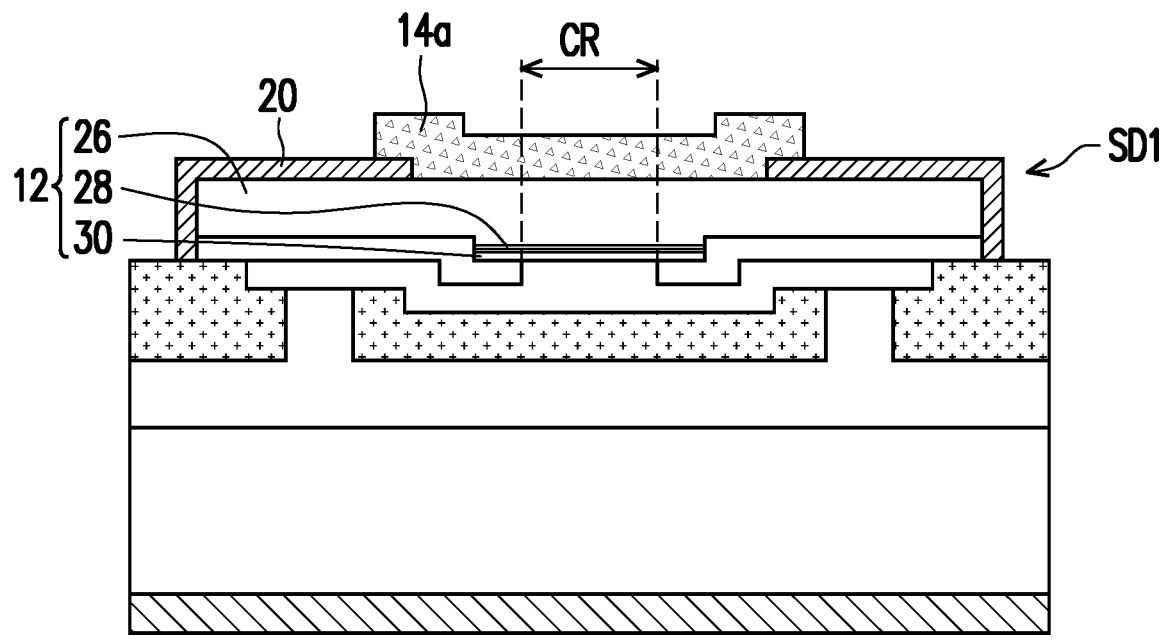

Referring to FIG. 7M, a first reflective layer 14a is formed on the first side SD1 of the epitaxial stacked layer 12, such that the first reflective layer 14a covers the bottom surface 26S2 of the first-type semiconductor layer 26 and the first electrode 20, and at least a part of the first reflective layer 14 overlaps the contact region CR.

As such, the manufacturing of the LED 1a illustrated in FIG. 2 is substantially completed.

Moreover, methods of manufacturing the LEDs 1b through 1d illustrated in FIG. 3 through FIG. 5 are substantially similar to that of the LED 1a, and the difference therebetween lies in that in the aforementioned processes, the mesa portions and the recess portions formed by etching the epitaxial stacked layer have different sizes, or alternatively, locations covered by the second electrode are different, and locations of the first through holes of the second reflective layer correspond to different locations of the epitaxial stacked layer, such that a person having ordinary skills of the art can manufacture the LEDs 1b through 1d illustrated in FIG. 3 through FIG. 5 by adjusting the manufacturing processes illustrated in FIG. 7A through FIG. 7H.

Based on the above, in the LED provided by the embodiments of the invention, the contact scope of the current conducting layer and the second-type semiconductor layer is served as the light-emitting scope, and the first and the second reflective layers overlap the light-emitting scope. Additionally, the main light emitting surface is formed on one of the first and the second reflective layers, and the light transmittance of the main light emitting surface is greater than 0% and less than or equal to 10%. Thus, a part of the light beams emitted from the active layer are transmitted through the first reflective layer (or the second reflective layer), and a part of light beams are reflected between the first and the second reflective layers one or more times to generate an effect similar to a laser resonant cavity, so as to be transmitted through the first reflective layer (or the second reflective layer). The light-emitting scope does not overlap the first and the second electrodes. The light-emitting angle of the LED can be significantly reduced, and thus, the LED can have high directivity and be suitable for serving as a light source for an optic fiber communication transceiver module. Moreover, the manufacturing method of the LED provided by one of the embodiments of the invention can be used to manufacture the LED described above and has lower manufacturing cost in comparison with the laser manufacturing.

What is claimed is:
1. A light emitting diode (LED), comprising:
an epitaxial stacked layer, comprising a first-type semiconductor layer, an active layer and a second-type semiconductor layer, the active layer being disposed between the first-type semiconductor layer and the second-type semiconductor layer, and the electrical property of the first-type semiconductor layer being opposite to that of the second-type semiconductor layer, wherein the epitaxial stacked layer has a first side adjacent to the first-type semiconductor layer and a second side adjacent to the second-type semiconductor layer;

a first reflective layer, disposed at the first side of the epitaxial stacked layer;

a second reflective layer, disposed at the second side of the epitaxial stacked layer, wherein a main light emitting surface is formed on the first reflective layer, and a light transmittance of the first reflective layer is greater than a light transmittance of the second reflective layer;

a current conducting layer, being in contact with the second-type semiconductor layer;

a first electrode, electrically connected to the first semiconductor layer; and a second electrode, electrically connected to the second-type semiconductor layer via the current conducting layer, wherein a contact scope of the current conducting layer and the second-type semiconductor layer is served as a light-emitting scope, wherein the light-emitting scope overlaps the first reflective layer and the second reflective layer, but does not overlap the first electrode and second electrode.

2. The LED as recited in claim 1, wherein the epitaxial stacked layer has a mesa portion and a recess portion which is recessed with respect to the mesa portion, the mesa portion comprises a part of the first-type semiconductor layer, the active layer and the second-type semiconductor layer, and the recess portion comprises the other part of the first-type semiconductor layer, wherein the first electrode overlaps the recess portion, and the second electrode overlaps the mesa portion.

3. The LED as recited in claim 1, wherein a first distance is configured between the first electrode and the second reflective layer, and a second distance is configured between the second electrode and the second reflective layer.

4. The LED as recited in claim 1, comprising a substrate, wherein the epitaxial stacked layer, the second reflective layer, the current conducting layer, the first electrode and the second electrode are disposed at one side of the substrate, and the first reflective layer is disposed at another side of the substrate.

5. The LED as recited in claim 1, comprising a conductive substrate, wherein the epitaxial stacked layer, the second reflective layer, the current conducting layer and the first electrode are disposed at one side of the conductive substrate, the second reflective layer is disposed at another side of the conductive substrate, and the second electrode is electrically connected to the second-type semiconductor layer via the current conducting layer and the conductive substrate.

6. The LED as recited in claim 1, wherein the second reflective layer has a plurality of first through holes, and at least a part of the first through holes overlap the second-type semiconductor layer.

7. The LED as recited in claim 1, wherein the second reflective layer has a plurality of first through holes, and the first through holes do not overlap the second-type semiconductor layer.

8. The LED as recited in claim 1, comprising a current blocking layer disposed between the epitaxial stacked layer and the current conducting layer, wherein the current blocking layer has at least one second through hole, the at least one second through hole exposes a part of the epitaxial stacked layer, and the current conducting layer is in contact with the second-type semiconductor layer by passing through the at least one second through hole.

9. The LED as recited in claim 1, wherein a reflectivity of the first reflective layer is greater than a reflectivity of the second reflective layer.

10. The LED as recited in claim 1, wherein a reflectivity of the second reflective layer is greater than a reflectivity of the first reflective layer.

11. The LED as recited in claim 1, wherein at least one of the first electrode and the second electrode comprises a welding portion and at least one finger portion extended from the welding portion.

* * * * *